United States Patent [19]

Little

[11] 4,392,297
[45] Jul. 12, 1983

[54] PROCESS OF MAKING THIN FILM HIGH EFFICIENCY SOLAR CELLS

[75] Inventor: Roger G. Little, Bedford, Mass.
[73] Assignee: Spire Corporation, Bedford, Mass.
[21] Appl. No.: 390,172
[22] Filed: Jun. 21, 1982

Related U.S. Application Data

[62] Division of Ser. No. 209,541, Nov. 20, 1980, abandoned.

[51] Int. Cl.³ .......................................... H01L 31/18
[52] U.S. Cl. .................................... 29/572; 136/261; 136/262; 148/1.5; 148/175; 357/30
[58] Field of Search ................... 29/572; 148/1.5, 175; 136/258, 261, 262; 357/30

[56] References Cited

U.S. PATENT DOCUMENTS 3,935,040  1/1976  Mason ................................. 148/175

OTHER PUBLICATIONS

S. S. Lau et al., "Heteroepitaxy of Deposited Amorphous Layer By Pulsed Electron–Beam Irradiation", *Appl. Phys. Lett.,* vol. 33, pp. 235–237, (1978).
I. Golecki et al., "Heteroepitaxy of a Deposited Amorphous Germanium Layer on a Silicon Substrate by Laser Annealing", *Thin Solid Films,* vol. 57, pp. L13–L15, (1979).
R. J. Stirn, "Galicon Solar Cells for High-Efficiency Low-Cost Arrays," Advanced Photovoltaic Development Group, Jet Propulsion Lab., (Aug. 1979).
"High Efficiency Thin–Film GaAs Solar Cells", Quarterly Report No. 2, SERI Contract No. XJ-903171, Jet Propulsion Lab., (Jan. 1980).
J. C. C. Fan et al., "GaAs Shallow-Homojunction Solar Cells," *Cont. Record, 14th IEEE Photovoltaic Specialists Meeting,* (1980), pp. 1102–1105.

Primary Examiner—Aaron Weisstuch
Attorney, Agent, or Firm—Morse, Altman & Dacey

[57] ABSTRACT

Process of making thin film materials for high efficiency solar cells on low-cost silicon substrates. The process comprises forming a low-cost silicon substrate, forming a graded transition region on the substrate and epitaxially growing a thin gallium arsenide film on the graded transition region. The process further includes doping the thin gallium arsenide film and forming a junction therein. The graded transition region preferably is a zone refined mixture of silicon and germanium characterized by a higher percentage of germanium at the surface of the region than adjacent the substrate. The process also includes the formation of homojunctions in thin gallium arsenide films.

Solar cells made from the materials manufactured according to the process are characterized by a high conversion efficiency, improved stability and relatively low unit cost.

9 Claims, 5 Drawing Figures

PROCESS OF MAKING THIN FILM HIGH EFFICIENCY SOLAR CELLS

This is a division, of application Ser. No. 209,541 filed on Nov. 20, 1980, abandoned.

BACKGROUND OF THE INVENTION

1. Field of the Invention

The present invention relates generally to a process of making thin film materials for solar cells and, more particularly, to a process of making thin film gallium arsenide materials for high efficiency solar cells on low-cost silicon substrates.

2. The Prior Art

For the large scale photovoltaic conversion of sunlight into electric power, very low-cost yet high efficiency solar cells are needed. Today, most solar cells are made from single-crystal silicon material. These single-crystal silicon materials are anything but low-cost, however. Furthermore, the maximum theoretical conversion efficiency for single-crystal silicon solar cells under maximum illumination with solar light on the ground at sea level (AM1) is about 23%. Solar cells made from single-crystal gallium arsenide (GaAs) materials, on the other hand, have a maximum theoretical conversion efficiency under maximum illumination on AM1 of about 27%, i.e., higher than that for single-crystal silicon cells. Because of this high efficiency and due to its physical properties, gallium arsenide comes close to the optimum for solar cell materials. Owing to the high absorption coefficient for visible light of a GaAs cell, all light is absorbed in a surface layer of the cell not more than about one millimicron ($\mu m$) thick. Furthermore, at high temperatures, particularly above 100° C., the performance of GaAs solar cells is better than that of silicon cells. The reason for this better performance is twofold. First, the voltage decrease with temperature is about 2.6 mV per °C. of temperature increase for a GaAs cell, a voltage decrease which is less than that for a silicon cell. As a result, the power of GaAs cells decreases less per °C. temperature increase than that of silicon cells. Second, the open circuit voltage of GaAs cells at room temperature is only slightly less than one volt, which is appreciably higher than that of silicon cells. Consequently, the voltage decrease as a percentage of the original voltage per °C. of temperature increase is comparatively low for GaAs cells.

Material consumption per unit of GaAs solar cells is high, however, because a monocrystalline GaAs substrate is needed. In addition, high purity arsenic is a rare and expensive element while high purity gallium is not so rare although also very expensive. Gallium arsenide materials first must be transformed into the single-crystal state before high efficiency solar cells can be made therefrom. Polycrystalline GaAs films not only result in low efficiency cells but also exhibit instability. Attempts to grow thin film GaAs materials on foreign substrates so as to reduce material consumption per unit cells have been frustrated thus far primarily due to grain size limitations and substrate-film contamination. Presently known fabrication techniques, therefore, hold little promise for the economic large-scale production of GaAs materials for use as high efficiency, low-cost solar cells.

SUMMARY OF THE INVENTION

It is a principal object of the present invention to overcome the above shortcomings by providing a process for the large-scale manufacture of low-cost thin film materials for high efficiency solar cells.

More specifically, it is an object of the present invention to provide a process of making low-cost, thin film, single-crystal gallium arsenide materials for high efficiency solar cells on low-cost silicon substrates. The process essentially comprises forming a low-cost silicon substrate, forming a graded transition region on the substrate and epitaxially growing a thin gallium arsenide film on the graded transition region. Preferably, the silicon substrate is either a low-cost single-crystal silicon or a metallurgical grade polycrystalline silicon. Preferably, the graded transition region is a zone refined mixture of silicon and germanium characterized by a higher percentage of germanium at the surface of the region that adjacent the substrate. Preferably the epitaxial growing of the thin gallium arsenide film on the transition region includes depositing the thin gallium arsenide film preferably in the amorphous state and transforming this amorphous film to a single-crystal gallium arsenide structure by a directed energy processing technique. Preferably, such a directed energy processing technique involves the application of a large-area pulsed electron beam to the amorphous gallium arsenide film. Upon exposure to the pulsed electron beam, the GaAs film melts and recrystallizes in a single-crystal structure.

Solar cells made from the thin film materials manufactured according to the process of the invention are characterized by a high conversion efficiency, improved stability and relatively low unit cost.

Other objects of the present invention will in part be obvious and will in part appear hereinafter.

The invention accordingly comprises the process and the product of the present disclosure, its components, parts and their interrelationships, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawings, wherein.

DETAILED DESCRIPTION OF PREFERRED EMBODIMENTS

Figure 1:
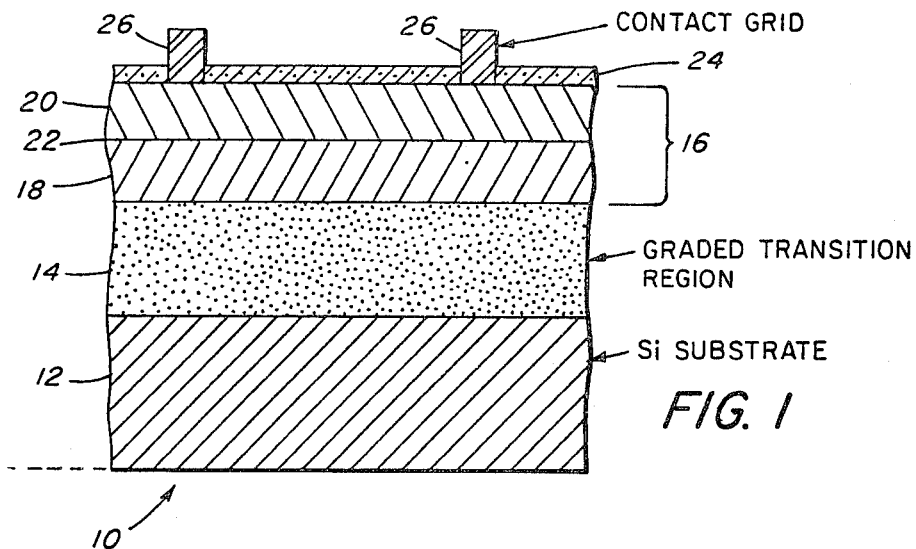
FIG. 1 is a schematic cross-sectional view of a representative high efficiency, thin film, single-crystal solar cell structure made from thin film materials manufactured according to the process of the invention.

In general, the present invention provides a process for the large-scale manufacture of low-cost thin film materials for high efficiency solar cells. Preferably, the thin film materials are made of thin gallium arsenide (GaAs) films epitaxially grown on low-cost silicon substrates with the aid of a graded transition region. The graded transition region preferably is a zone refined mixture of silicon (Si) and germanium (Ge) characterized by a higher percentage of germanium at the surface of the region that adjacent the silicon substrate. The process also includes the formation of homojunctions in gallium arsenide films.

A salient feature of the process of the invention is the use of directed energy processing techniques. The preferred directed energy processing technique involves the use of large-area pulsed electron beams. Pulsed electron beam processing is inherently a low-temperature process, reducing thereby the likelihood of contamination between heterostructure layers. The employment of large-area (three inches or better) pulsed electron beams to form single-crystal heterostructures with homojunctions allows the low-cost, large-scale manufacture of thin film gallium arsenide solar cells characterized by high conversion efficiency and improved cell stability. Thin film gallium arsenide solar cells made from the thin film materials manufactured according to the process of the invention generally exhibit better than eighteen percent (18%) conversion efficiencies under maximum illumination with solar light on the ground at sea level (AM1).

The use of pulsed electron beam processing not only allows the epitaxial growth of thin films at low temperatures but it also permits ion-implanted junctions and homojunctions to be annealed at low temperatures. (The terms "epitaxy" and "epitaxial growth" as used herein are intended to define the growth of one crystal on the surface of another crystal in which the growth of the deposited crystal is oriented by the lattice structure of the substrate. The term "epitaxial layer" as used herein is intended to define a semiconductor layer having the same crystalline orientation as the substrate on which it is grown.) Processing the thin films at low temperatures, in turn, allows the use of much less demanding film deposition techniques. This is so since pulsed electron beam (PEB) epitaxy results in crystalline structures to be formed in the thin films independent of the film deposition technique and independent of the treatment of the substrate. For instance, low-temperature chemical vapor deposition (CVD) resulting in polycrystalline films, evaporation, sputtering, plasma ion deposition and other deposition techniques can all be considered in the process of the invention. All these deposition techniques can be used because, upon exposure to a pulsed electron beam, the deposited thin films melt and then regrow in liquid-phase epitaxy (LPE) to single-crystal structure. In addition, low temperature processing has the advantages of reduced stress at interfacial layers, reduced autodoping of one layer by an adjacent layer, and improved crystallinity. Ion implantation of the thin film materials, followed by electron beam annealing, also makes for regions of doping concentrations above the solid solubility level that is achievable with conventional furnace annealing techniques.

It is the employment of the graded transition region on top of the silicon substrate, however, that renders the silicon substrate receptive for the epitaxial growing of the thin gallium arsenide film thereon. For it is this graded transition region that provides for lattice constant matching between the silicon substrate and the thin gallium arsenide film. And without this lattice constant matching, the pulsed epitaxial growing of the thin gallium arsenide film on the silicon substrate would not be feasible. (The term "lattice constant" as used herein is intended to define a parameter defining the unit cell of a crystal lattice, i.e., the length of one of the edges of the cell or an angle between the edges of the cell.) The lattice constant for silicon is 5.431 Angstroms and for gallium arsenide it is 5.653 Angstroms. This represents a considerable mismatch between the silicon and the gallium arsenide. The lattice constant for germanium is, on the other hand, 5.657 Angstroms. Thus, only 0.004 Angstroms separate the lattice constant of gallium arsenide from that of germanium—a nearly perfect lattice constant match between GaAs and Ge. As mentioned, the graded transition region preferably is a zone-refined mixture of Si and Ge characterized by a higher percentage of germanium at the surface of the transition region than adjacent the silicon substrate.

The combined effect of having a graded transition region and employing large-area pulsed electron beam processing in the process of the invention permits the use of inexpensive silicon substrates. The silicon substrate need only be of large-area crystalline structure and be sufficiently conductive to perform as the back surface contact for the thin GaAs film solar cell made from the thin film materials manufactured according to the process of the invention. The purity or electrical quality of the silicon substrate, therefore, is of little, if any, consequence since impurities from the silicon substrate will not diffuse into the thin GaAs film during the processing. The use of inexpensive silicon substrates, such as metallurgical grade polycrystalline silicon, in the process of the invention significantly reduces, however, the material consumption of thin GaAs films per unit of GaAs solar cells.

Figure 2:
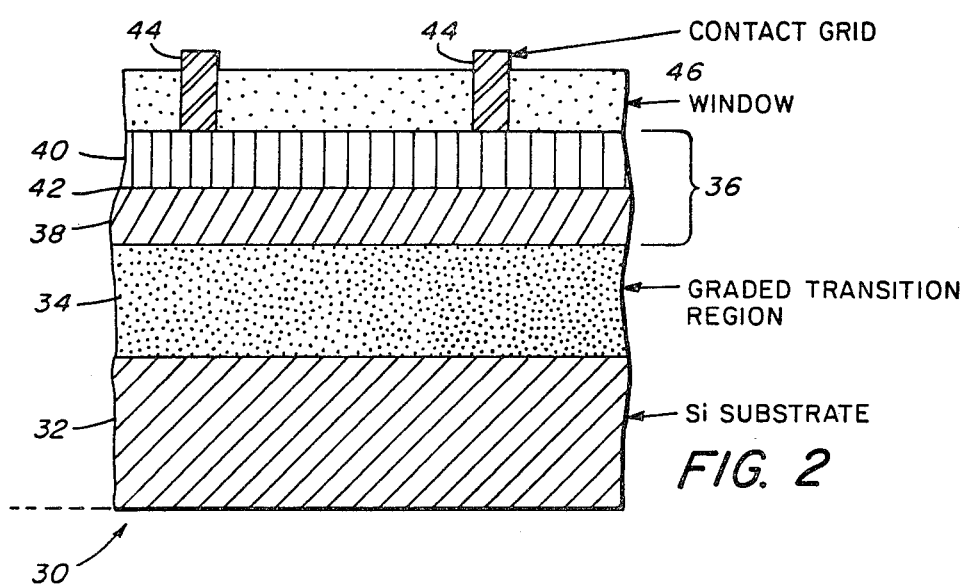
FIG. 2 is a schematic cross-sectional view of a second representative high efficiency, thin film, single-crystal solar cell structure made from thin film materials manufactured according to the process of the invention.
Figure 3:
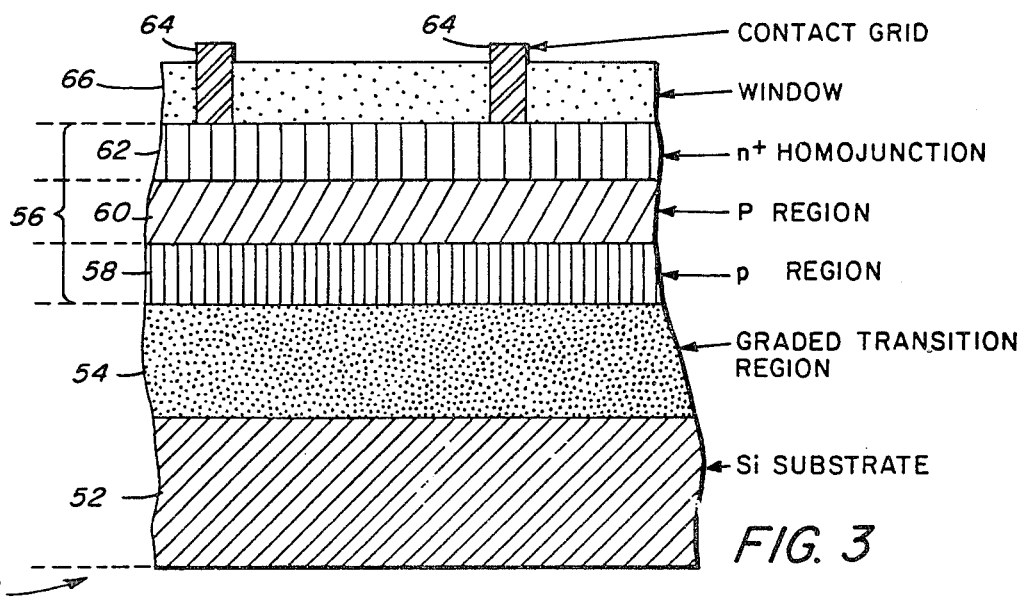
FIG. 3 is a schematic cross-sectional view of a third representative high efficiency, thin film, homojunction, single-crystal solar cell structure made from thin film materials manufactured according to the process of the invention.

The process of making thin film GaAs materials for high efficiency solar cells according to the invention is best described in detail with reference to the drawings. In FIGS. 1-3 are shown schematic cross-sectional views of representative high efficiency solar cells made from thin film materials manufactured according to the process of the invention.

A representative high efficiency solar cell structure 10 is depicted in FIG. 1. Solar cell structure 10 comprises an inexpensive silicon substrate 12, a graded transition region 14, a thin GaAs film 16 having a p-region 18 and an n-region 20 separated by a p-n barrier junction 22, a conductive anti-reflective (AR) coating 24, and a front ohmic contact grid 26.

FORMATION OF THE TRANSITION REGION

As stated, the silicon substrate 12 is formed of a low-cost, large-area crystalline structure, such as a single-crystal Czochralski-grown silicon material. The substrate 12 is formed with little regard for its purity or electrical quality except insofar that it be sufficiently conductive to function as the back surface ohmic contact for the solar cell 10. The graded transition region 14 is formed on top of the silicon substrate 12. As stated, the graded transition region 14 is a zone refined mixture of silicon and germanium characterized by a higher percentage of germanium at the top surface of region 14 than adjacent the silicon substrate 12. The function of this transition region 14 is, as also stated, to achieve lattice constant matching with the thin GaAs film 16. The transition region 14 is formed by the application of pulsed electron beam epitaxy of germanium on silicon. First, a thin, amorphous layer of germanium is deposited on top of the silicon substrate 12. Deposition of the amorphous germanium layer can be effected in a plurality of ways. One preferred way is by evaporation of the amorphous germanium layer in a suitable vacuum environment. The deposited Ge layer is then subjected to submicrosecond pulsing by a large-area, high intensity electron beam. The pulse of thermal energy from the electron beam causes the thin amorphous Ge layer and a thin silicon layer at the Ge-Si interface to melt. The melt front is caused to propagate normally in the plane of the Ge-Si interface from the underlying silicon layer to the overlying germanium layer. When this melt region resolidifies, it resolidifies epitaxially. Not only is there a thorough Ge-Si mixing at the interface, but in addition pulse recrystallization is achieved and a high-quality heteroepitaxial layer is formed. In this first recrystallized heteroepitaxial layer, there is proportionally more silicon present than in the subsequently formed layers making up the transition region 14. The Si-Ge transition region 14 preferably is formed in a multistep process. That is, after the above deposition and pulsing of the first thin, amorphous Ge layer, the deposition and pulsing steps are repeated until a graded, zone refined mixture of a high-quality Si-Ge transition region 14 has been achieved. With each subsequent deposition of a thin, amorphous Ge layer and its pulsed recrystallization, progressively more and more germanium will be present in the transition region 14 until finally at the top surface of the region 14, the top recrystallized heteroepitaxial layer will contain mostly germanium and very little silicon. This is a result of the zone refining of the germanium and is best described with reference to FIG. 4.

Figure 4:
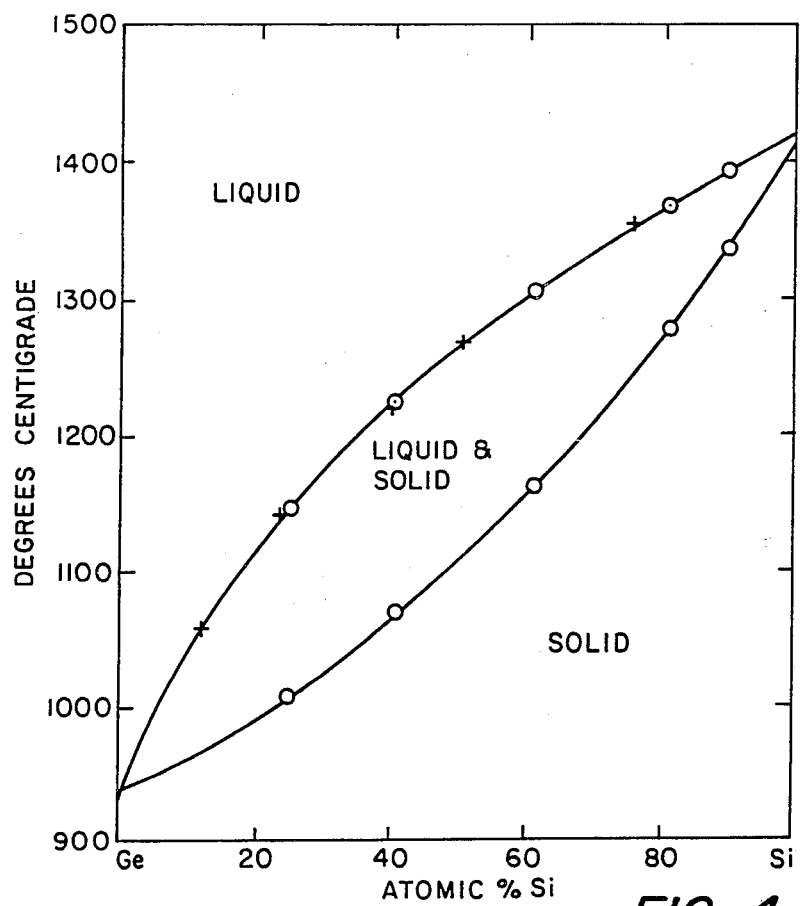
FIG. 4 is a germanium-silicon phase diagram.

FIG. 4 depicts the phase diagram of a mixture of germanium and silicon upon heating and cooling. The phase diagram plots the relative atomic percentages of germanium and silicon in the mixture against temperature in the range of 900° C. to 1500° C. As may be observed in this phase diagram, when germanium and silicon are thoroughly mixed and melting occurs, a motion of the liquid-solid (i.e., freezing) interface upon cooling causes zone refining of the germanium from the substrate 12 toward the top surface of the transition region 14. The result is germanium enrichment at the top surface of the transition region 14. Since, as already stated, germanium represents a near-perfect lattice constant match to gallium arsenide, the transition region 14 renders the silicon substrate 12 receptive for the epitaxial growing thereon of the gallium arsenide films, as more fully described below.

Figure 5:
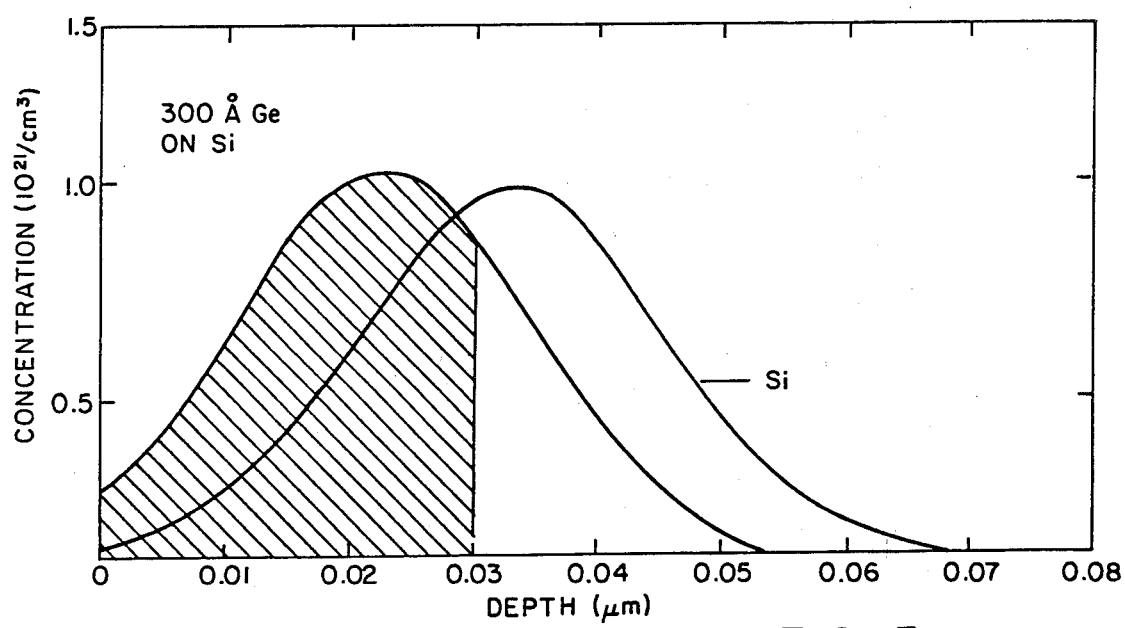
FIG. 5 depicts ion implantation profiles of germanium directly into silicon and of germanium into 300 Angstroms (A) of germanium deposited on silicon.

A variation in the deposition by evaporation of the amorphous germanium layers on the silicon substrate 12 is represented by "stitching" the layers in place. This "stitching" of the amorphous Ge layers at selected points to the substrate 12 is effected by impinging high energy ions at the Ge layers at those selected points. This "stitching" approach with high energy ions already causes a mixing of the germanium and the silicon at their interfaces even before the pulse melting thereat by the application of PEB epitaxy. This mixing effect can best be observed in FIG. 5. FIG. 5 shows the ion implantation profiles (the shaded area) of 50 keV Ge, $1 \times 10^{15}/cm^2$, first into silicon directly, and second into a 300 Angstrom thick layer of Ge deposited on Si. FIG. 5 plots the depth (in $\mu m$) of ion penetration by the Ge against the concentration (in $10^{21}/cm^3$).

Another preferred way of depositing the amorphous germanium layer on top of the silicon substrate 12 is by low-temperature chemical vapor deposition (CVD). Such low-temperature CVD of the amorphous germanium initially results in a polycrystalline layer of Ge. Upon pulsing with the large-area, high intensity electron beam, however, the Ge layer is not only zone refined with the silicon substrate 12 but is also recrystallized epitaxially into a high-quality, single-crystal Si/Ge transition region 14 on the silicon substrate 12.

FORMATION OF THE THIN GaAs FILM

With the formation of the graded transition region 14 characterized by an enriched germanium layer at the top surface of the region 14, the silicon substrate 12 has been rendered receptive to the formation thereon of the thin GaAs film 16. The preferred approach to the formation of this GaAs film 16 is quite similar to the formation of the Si/Ge transition region 14 above discussed. One or more thin films of GaAs are first deposited on top of the transition region 14. The deposited thin GaAs films are then subjected to pulsed electron beam (PEB) processing in order to regrow epitaxially the GaAs films into a high-quality, single-crystal structure. Again, a number of film deposition techniques can be used to deposit the GaAs films because the PEB epitaxy process is insensitive to film structure or contamination. Either evaporation or low-temperature CVD is used to deposit the thin GaAs films on the Ge rich surface of the transition region 14. If for some reason adequate pulsed epitaxial growth of the thin GaAs film upon the Ge rich surface of the transition region 14 is not achieved, metal-organic chemical vapor deposition (MO-CVD) is then preferably used. MO-CVD effects the deposition of the thin GaAs film at higher tempeature than CVD and thus achieves direct epitaxial grownt of the GaAs film on the transition region 14. The advantages of pulsed electron beam epitaxial growth processing include: reduced thermal stresses that might otherwise be generated at the interface of the GaAs film 16 and of the Ge rich surface of the transition region 14 and, more importantly, reduced diffusion of Ge into the GaAs film 16. This advantageous dual result flows from the fact that PEB epitaxy is essentially a low temperature process and whose operating parameters are so chosen that the Ge rich surface of the transition region 14 remains essentially cold during the processing. The result is a high-quality, single-crystal, thin film GaAs structure free of contamination and of thermal stress effects.

The thin GaAs films 16 preferably are doped with one dopant ion species during the deposition step, as is done conventionally. Other preferred methods of doping of the thin GaAs films 16 include ion implantation followed by pulsed electron beam annealing and PEB diffusion of surface-deposited thin doping film. Each of these two latter methods excels in achieving precise, highly concentrated doping of the thin GaAs films 16. Due to such high-level doping, concentrations of dopant species higher than solid solubility levels are achieved in the thin GaAs films 16. These high concentrations of dopant species provide, in turn, very high conductivity in the doped regions of the solar cell 10 structure.

Formation of the p-n junction barrier 22 in the doped thin GaAs film 16 is also preferably effected either by ion implantation followed by PEB annealing or by PEB diffusion of surface-deposited thin doping film. The deposition of the doping films preferably is effected by evaporation, followed by pulsing with an electron beam to effect the diffusion of the dopant ion species from the doping films into the thin GaAs film 16.

The first surface ohmic contact grid 26 preferably is formed in either of two ways. The first is by ion implantation for very high dopant concentrations to effect ohmic contact with evaporated metallization. The second is by pulsed electron beam sintering of metallization patterns evaporated on the GaAs film 16. The solar cell 10 structure is surface finished by the application thereon, as by evaporation or sputtering, of the conductive anti-reflective (AR) coating 24.

A second representative high efficiency solar cell 30 is shown in a schematic cross-sectional view in FIG. 2. Solar cell 30 is in all essential respects similar in construction to the solar cell 10 shown in FIG. 1. Solar cell 30 comprises a low-cost silicon substrate 32, a graded transition region 34, a thin GaAs film 36 having an n-region 38 and a p-region 40 separated by a p-n barrier junction 42, a front surface ohmic contact grid 44, and a gallium-aluminum-arsenide(GaAlAs) window 46 in lieu of the conductive AR coating 24. Preferably, the low-cost silicon substrate is a metallurgical grade or upgraded metallurgical grade silicon, such as for example, Wacker cast polycrystalline silicon. The graded transition region 34 is identical to the graded transition region 14 of the solar cell 10 and is formed in the same way. Like transition region 14, region 34 is a zone refined mixture of silicon and germanium characterized by a higher percentage of Ge at the surface of the region 34 than adjacent the substrate 32. Thus, the region 34 renders the underlying low-cost Si substrate 32 receptive for the epitaxial growth thereon of the thin GaAs film 36 in the same way as the GaAs film 16 was grown in the solar cell 10. Only the doping differentiates film 36 from film 16 in that the respective p and n regions thereof are reversed in position. Also, the front surface ohmic contacts 44 are formed in the same way as the contacts 26 of the cell 10. However, in place of the conductive AR coating, a GaAlAs window 46 is formed, again by PEB diffusion in a low temperature process. The GaAlAs window 46 improves the surface recombination velocity, hence the conversion efficiency of the resultant solar cell 30. Window 46 preferably is formed by depositing, such as by evaporation, thin films of aluminum over the thin GaAs film 36 and then diffuse and thereby alloy the aluminum into the GaAs film 36 using a large-area, high-intensity pulse of electrons. This low-temperature approach is advantageous in that it precludes autodoping and film contamination. The GaAlAs window 46 can also be formed by high-current ion implantation, followed by electron beam pulsing.

A third representative, thin film, single-crystal high-efficiency solar cell 50 is shown in FIG. 3. Solar cell 50 comprises a low-cost, such as metallurgical grade, silicon substrate 52, a graded Si-Ge transition region 54, a thin GaAs film 56 having a p+ region 58, a P region 60 and an n+ homojunction 62. A front surface contact grid 64 and a GaAlAs window 66 formed on the thin GaAs film 56 complete the solar cell 50. Thus, the structure of the thin GaAs film 56, particularly the addition of the homojunction 62, is what differentiates the representative solar cell 50 from the cells 10 and 30 above described. The addition of the homojunction 62 further contributes to increase the already high conversion efficiency of the resultant solar cell 50. The homojunction 62 is also responsible for improving the stability of the cell 50. During the initial formation of the thin GaAs film 56, by the epitaxial growth thereof on the germanium-rich surface of the graded transition region 54, a back surface field preferably is formed in the p+ region 58. This back surface field is formed by the diffusion of germanium into this p+ region 58 during its pulsing with the high-intensity electron beam.

FORMATION OF THE HOMOJUNCTION

Preferably, the homojunction 62 is formed in the third representative high efficiency solar cell 50 as follows. Following the preferred autodoping in the formation of the p+ region 58, a lightly doped P region 60 of GaAs film is formed on the region 58 by FEB epitaxy. Then, a heavily doped n+ homojunction 62 is produced preferably by ion implantation using selenium (Se) ions. Selenium ions are preferred because of the close lattice match of a selenium ion substituting into an arsenide lattice site in gallium arsenide. Choice of a matched ion results in minimum lattice strain in the thin GaAs film 56, avoiding thereby undesirably high recombination rates. The ion-implanted selenium in the GaAs film region 62 is pulse electron beam annealed for ion activation and carrier concentration. The implanted and annealed region 62 preferably is then etched and oxidized to produce a shallow homojunction with a thin anodic oxide AR coating. The homojunction layer 62 alternatively is formed by depositing a thin selenium film on the thin GaAs film 56. The deposited selenium film is then irradiated by a pulsed electron beam to cause the selenium ions to diffuse, that is, to migrate into the gallium arsenide film 56. Deposition of the selenium film is preferably effected by evaporation or by low temperature CVD.

The front surface ohmic contacts 64 and the GaAlAs window 66 are formed on top of the homojunction layer 62 of the thin GaAs film 56 in the same manner as the contacts 44 and the window 46 were formed in the solar cell 30 of FIG. 2.

CONCLUSION

Thus it has been shown and described a cost-effective process for the large-scale manufacture of thin film gallium arsenide materials useful for the making of high efficiency single-crystal solar cells on low-cost silicon substrates, which process satisfies the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. A process of forming a high efficiency single-crystal, thin film, homojunction gallium arsenide solar cell on a single-crystal silicon substrate comprising:
   (a) forming a single-crystal silicon substrate;
   (b) forming a graded transition region on said substrate by deposition of a thin layer of germanium directly on said silicon substrate and pulsing said layer with an electron beam to effectuate thereby zone refining and mixing of said germanium layer and said silicon substrate;

(c) epitaxially growing a thin gallium arsenide film on said transition region;

(d) doping said thin gallium arsenide film with one dopant species;

(e) forming a homojunction in said thin, doped gallium arsenide film by introducing therein a second dopant species; and (f) forming front ohmic contacts on said gallium arsenide film.

2. The process of claim 1 wherein said deposited thin layer of germanium is in the amorphous state.

3. The process of claim 2 wherein said depositing said thin layer of germanium is effected by low-temperature chemical vapor deposition.

4. The process of claim 1 wherein said depositing said thin layer of germanium is effected by evaporation.

5. The process of claim 4 further including stitching the evaporated layer of germanium at selected points to said substrate by impinging high energy ions at said layer at said selected points.

6. The process of claim 1 wherein said pulsing said layer of germanium causes a melting of said layer and of said silicon substrate at their interface, which molten interface upon cooling effects zone refining and mixing the germanium with the silicon in said transition region from said substrate toward the surface of said transition region.

7. The process of claim 6 wherein said zone refining and mixing of the germanium with the silicon results in a higher percentage of germanium at said transition region surface than adjacent said silicon substrate.

8. The process of claim 1 wherein said epitaxially growing and doping said thin gallium arsenide film, said forming said homojunction and said front ohmic contacts includes low-temperature pulsed electron beam processing.

9. A process of forming a high efficiency single-crystal, thin film, homojunction gallium arsenide solar cell on a metallurgical grade silicon substrate comprising:

(a) forming a metallurgical grade silicon substrate;

(b) forming a graded transition region on said substrate by successive depositions of thin layers of germanium, with each of said layers being successively pulsed with an electron beam, causing thereby a melting of substantially equal thickness of said germanium layer and of said silicon substrate at their interface, which molten interface upon cooling effects zone refining and mixing of the germanium with the silicon in said transition region from said silicon substrate toward the surface of said transition region, said transition region comprising a mixture having a higher percentage of germanium at the surface of said transition region than adjacent said silicon substrate;

(c) epitaxially growing a thin gallium arsenide film on said transition region;

(d) doping said thin gallium arsenide film with one dopant species;

(e) forming a homojunction in said gallium arsenide film by introducing therein a second dopant species; and (f) forming front contacts and a gallium-aluminum-arsenide window on said gallium arsenide film.

* * * * *